United States Patent
Yoshikawa (10) Patent No.: US 6,724,231 B2
(45) Date of Patent: Apr. 20, 2004

(54) CLOCK SIGNAL PROPAGATION GATE AND SEMICONDUCTOR INTEGRATED CIRCUIT INCLUDING SAME

(75) Inventor: Atsushi Yoshikawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/341,497

(22) Filed: Jan. 14, 2003

(65) Prior Publication Data

US 2004/0036510 A1 Feb. 26, 2004

(30) Foreign Application Priority Data

Aug. 22, 2002 (JP) .................................... 2002-241463

(51) Int. Cl.[7] .................................................. G06F 1/04
(52) U.S. Cl. ....................... 327/291; 327/298; 326/95
(58) Field of Search .............................. 327/172–176, 327/291–298; 326/93, 95

(56) References Cited

U.S. PATENT DOCUMENTS 6,069,498 A * 5/2000 Noll et al. ..................... 327/49

FOREIGN PATENT DOCUMENTS

JP          2001-203328      7/2001

OTHER PUBLICATIONS

P. J. Restle, et al., "A Clock Distribution Network for Microprocessors", Symposium on VLSI Circuits Digest of Technical Papers, 2000, pp. 184–187.

R. Krishnamurthy, et al., "P–boosted Source Followers: A Robust Energy–efficient Bus Driver Technique", Symposium on VSLI Circuits Digest of Technical Papers, 2001, 2 pages.

* cited by examiner

*Primary Examiner*—Kenneth B. Wells
(74) *Attorney, Agent, or Firm*—Oblon, Spivak, McClelland, Maier & Neustadt, P.C.

(57) ABSTRACT

A semiconductor integrated circuit including a clock signal propagation gate capable of reducing clock signal skew and controlling a clock signal is provided. The clock signal inputted at a clock origin propagates through buffers (30, 31) to a clock propagation control gate (32). The two-level clock propagation control gate (32) includes an inverter at the first level, and a NAND gate at the second level. The clock signal passed through the clock propagation control gate (32) propagates through buffers (33, 34) to reach a sequential circuit (35) at an end point. The NAND gate (39) at the second level of the clock propagation control gate (32) includes nMOS transistors (42, 43) and pMOS transistors (40, 41). The inverter (36) at the first level includes a pMOS transistor (37) and an nMOS transistor (38).

5 Claims, 8 Drawing Sheets

CLOCK SIGNAL PROPAGATION GATE AND SEMICONDUCTOR INTEGRATED CIRCUIT INCLUDING SAME

BACKGROUND OF THE INVENTION

1. Field of the Invention

The present invention relates to a semiconductor integrated circuit including a clock signal propagation gate. More particularly, the invention relates to techniques for reducing clock signal skew (or a time difference between clock signals arriving at respective end points) and for facilitating the delay adjustment of the clock signals.

2. Description of the Background Art

Design of a clock distribution circuit is important in synchronous pipeline design of LSI circuits. Techniques for the clock distribution circuit are mainly of two types: a single-buffer scheme and a clock-tree scheme. The clock-tree scheme can achieve reductions in power consumption and in area as compared with the single-buffer scheme, and also can easily control clock signals.

Figure 5:
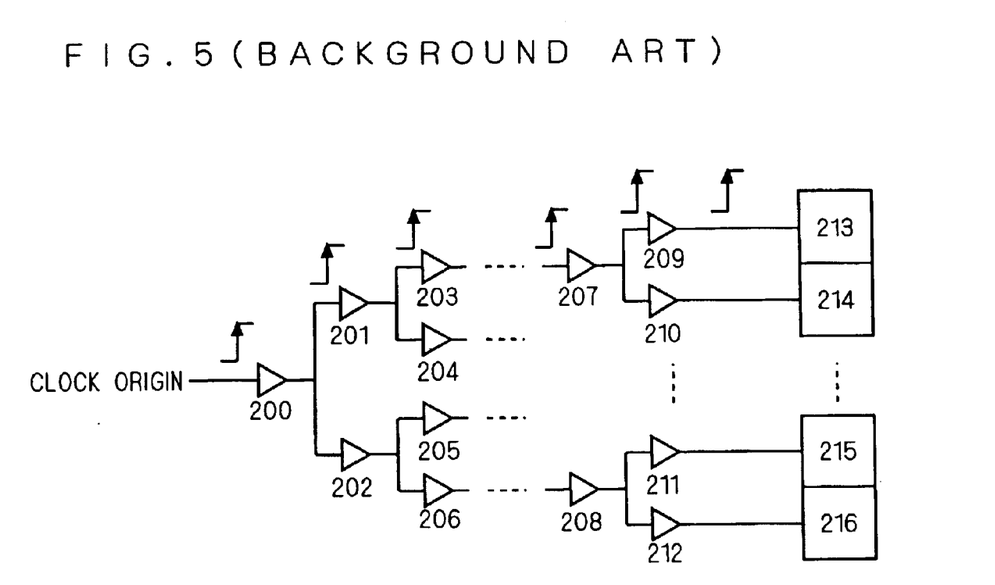
FIG. 5 is a circuit diagram of a background art clock distribution circuit of a clock-tree type.

FIG. 5 is a circuit diagram of a typical clock distribution circuit of the clock-tree type. A clock signal inputted at a clock origin (or a starting point of a clock) is distributed through a buffer 200 to buffers 201 and 202. The clock signal passed through the buffer 201 is further distributed to buffers 203 and 204. Finally, these distributed clock signals reach sequential circuits (e.g., latches and flip-flops (FFs)) at the end points of the clock tree. Buffers 200 to 212 are shown in FIG. 5. Sequential circuits 213 to 216 each including a plurality of flip-flops operating on the rising edge of the clock signal are shown at the end points of the clock tree.

Various structures of the clock distribution circuit of the clock-tree type have been proposed. Recently, an H-tree scheme has been proposed which can provide a uniform layout of paths from the clock origin to the sequential circuits at the end points. The H-tree scheme is disclosed in "A Clock Distribution Network for Microprocessors," 2000 Symposium on VLSI Circuits Digest of Technical Papers.

Figure 6:
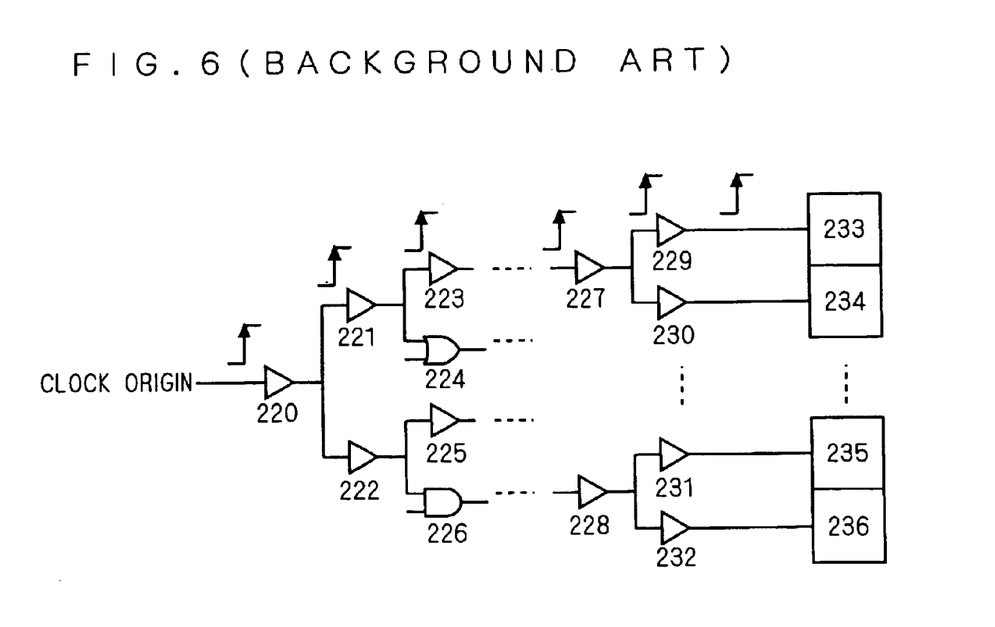
FIG. 6 is a circuit diagram of a background art clock distribution circuit of the clock-tree type capable of controlling a clock signal.

FIG. 6 is a circuit diagram of a clock distribution circuit of the clock-tree type capable of controlling the clock signal. The clock distribution circuit of FIG. 6 includes a control OR gate 224 and a control AND gate 226 in paths. These control gates 224 and 226 can stop feeding some or all of the clock signals to the sequential circuits at the end points. Buffers 220 to 223, 225, and 227 to 232 and sequential circuits 233 to 236 are shown in FIG. 6.

Figure 7A:
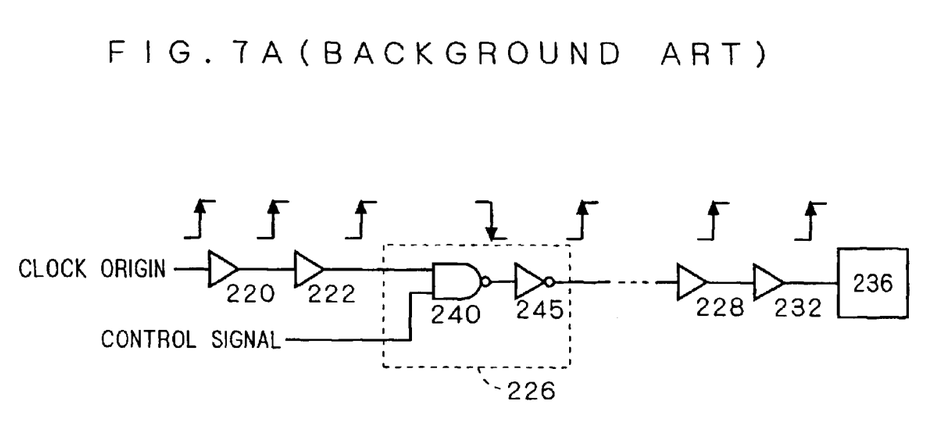
FIGS. 7A and 7B are partial circuit diagrams of a background art clock distribution circuit having a control AND gate.
Figure 7B:
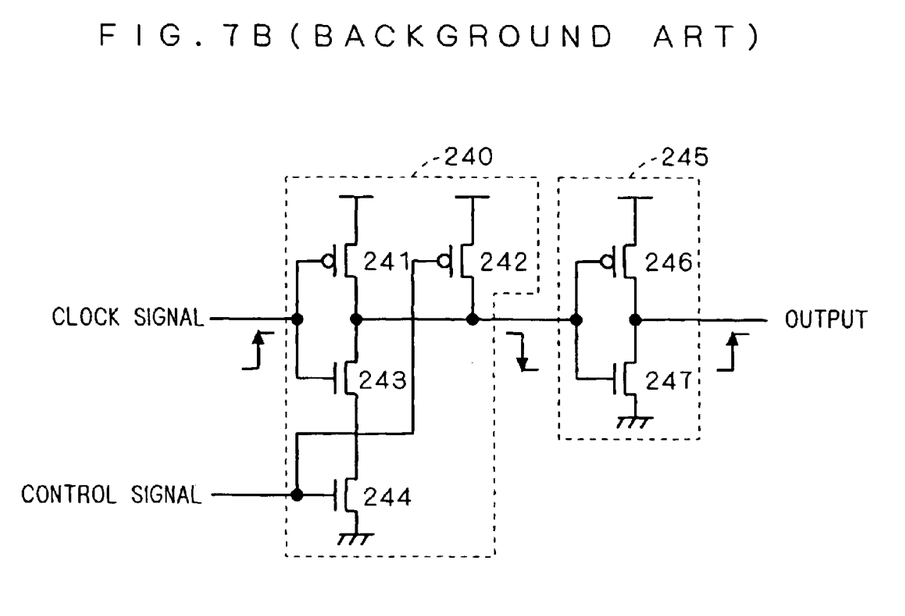

A path including the control AND gate 226 will be described. FIGS. 7A and 7B are partial circuit diagrams of the clock distribution circuit having the control AND gate. FIG. 7A shows a path from the clock origin to the sequential circuit 236 at one end point in the clock distribution circuit shown in FIG. 6. A clock signal inputted at the clock origin propagates through the buffers 220 and 222 to the control AND gate 226. The two-level control AND gate 226 includes an NAND gate 240 at the first level, and an inverter 245 at the second level.

FIG. 7B is a circuit diagram of the control AND gate 226. The NAND gate 240 at the first level includes pMOS transistors 241, 242 and nMOS transistors 243, 244. The inverter 245 at the second level includes a pMOS transistor 246 and an nMOS transistor 247.

The clock signal outputted from the control AND gate 226 propagates through buffers 228 and 232 to the sequential circuit 236 at the end point. The sequential circuit 236 shown in FIG. 7A is driven upon receipt of the rising edge of the clock signal.

The operation of the control AND gate 226 will be described. A control signal controls the propagation of the rising edge of the clock signal inputted to the control AND gate 226. When the control signal is LOW, the output from the control AND gate 226 remains LOW independently of the occurrence of a rising edge (or a LOW-to-HIGH signal transition) of the input clock signal. Thus, no rising edge of the clock signal propagates when the control signal for the control AND gate 226 is LOW.

On the other hand, when the control signal is HIGH, the input clock signal is inverted by the NAND gate 240 at the first level, and is then inverted again by the inverter 245 at the second level. Thus, the rising edge of the clock signal propagates when the control signal for the control AND gate 226 is HIGH.

Figure 8A:
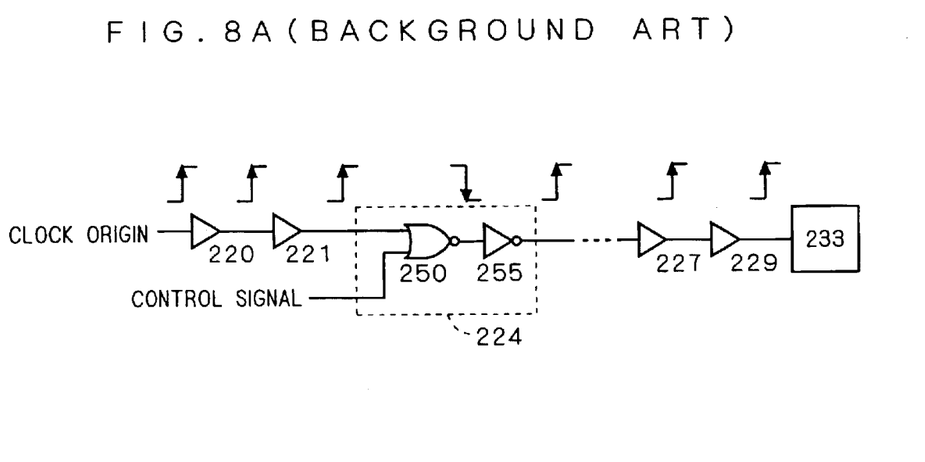
FIGS. 8A and 8B are partial circuit diagrams of a background art clock distribution circuit having a control OR gate.
Figure 8B:
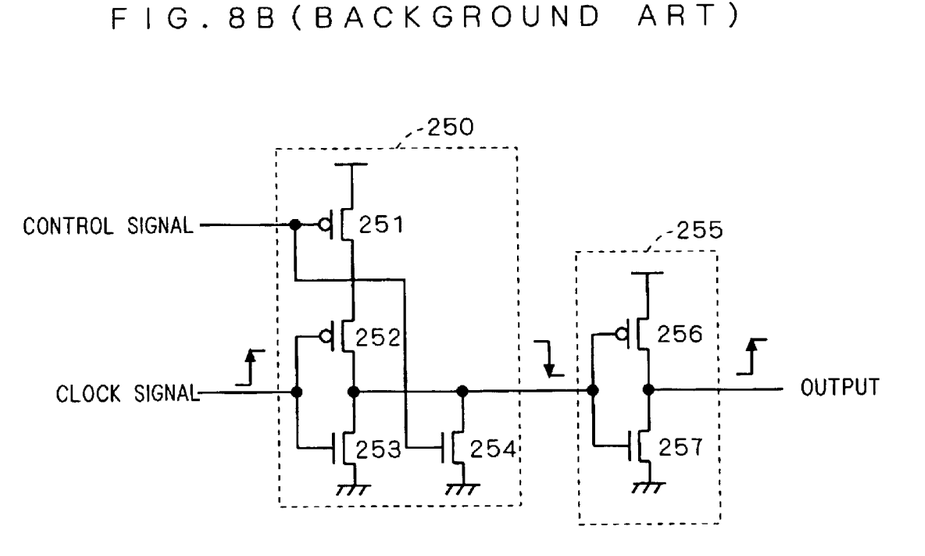

Next, a path including the control OR gate 224 will be described. FIGS. 8A and 8B are partial circuit diagrams of the clock distribution circuit having the control OR gate. FIG. 8A shows a path from the clock origin to the sequential circuit 233 at one end point in the clock distribution circuit shown in FIG. 6. FIG. 8B is a circuit diagram of the two-level control OR gate 224 which includes a NOR gate 250 at the first level and an inverter 255 at the second level. The NOR gate 250 at the first level includes pMOS transistors 251, 252 and nMOS transistors 253, 254. The inverter 255 at the second level includes a pMOS transistor 256 and an nMOS transistor 257.

A control signal controls the propagation of the rising edge of the clock signal inputted to the control OR gate 224. When the control signal is LOW, the input clock signal is inverted by the NOR gate 250 at the first level, and is then inverted again by the inverter 255 at the second level. Thus, the rising edge of the clock signal propagates when the control signal for the control OR gate 224 is LOW.

On the other hand, when the control signal is HIGH, the output from the control OR gate 224 remains HIGH independently of the occurrence of a rising edge of the input clock signal. Thus, no rising edge of the clock signal propagates when the control signal for the control OR gate 224 is HIGH.

In the clock distribution circuits of the clock-tree type shown in FIGS. 5 and 6, differences exist in length of interconnect lines, in the number of adjacent interconnect lines and in the number of gate levels, depending upon the paths from the clock origin to the sequential circuits at the end points. This produces a delay difference between clock signals, depending on the interconnect line paths, to result in a tendency toward higher clock signal skew (or a greater time difference between clock signals arriving at respective end points). Further, when the sequential circuit at the end point is driven by the rising edge of the clock signal, there is a need for the clock distribution circuit to propagate the rising edge of the clock signal.

Figure 9:
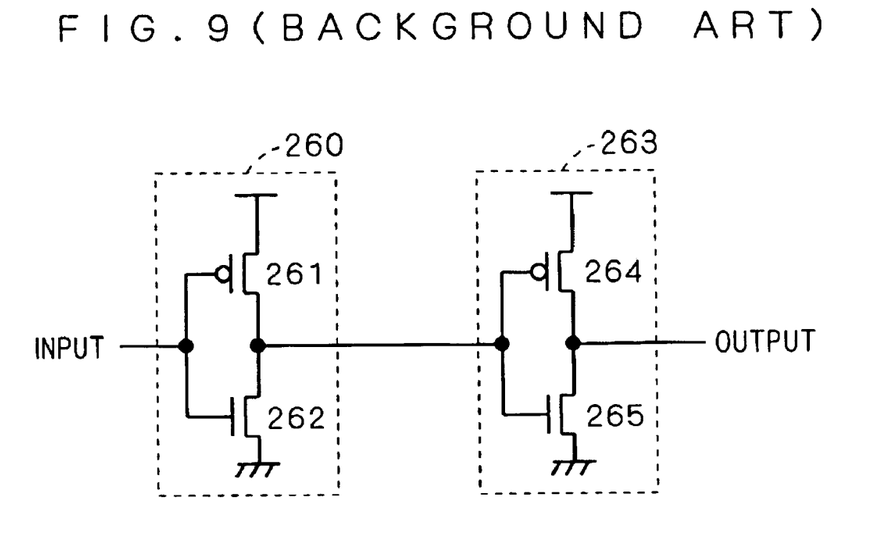
FIG. 9 is a circuit diagram of a buffer in a background art clock distribution circuit.

Each of the buffers in the clock distribution circuits shown in FIGS. 5 and 6 is a two-level buffer including two inverters 260 and 263, as shown in FIG. 9. The first-level inverter 260 includes a pMOS transistor 261 and an nMOS transistor 262, and the second-level inverter 263 includes a pMOS transistor 264 and an nMOS transistor 265. Since an interconnect line connected to the output of the buffer has a large parasitic capacitance, the pMOS transistor 264 for driving the interconnect line is designed to have a greater current-driving capability than that of the pMOS transistor 261, and the nMOS transistor 265 is designed to have a greater current-driving capability than that of the nMOS transistor 262. In general, the driving capability of the pMOS transistor 264 of the inverter 263 is less than that of the nMOS transistor 265 of the same inverter 263. Thus, if the rising edge of the clock signal is applied to the buffer shown in FIG. 9, the propagation delay of the clock signal increases after the clock signal passes through the buffer.

To solve the higher clock signal skew problem, it is necessary to increase the driving capability of the second-level inverter 263 or, particularly, the driving capability of the pMOS transistor 264. In other words, a solution to the problem is to increase the gate width of the pMOS transistor 264 of the second-level inverter 263. However, this solution increases the area of the pMOS transistor 264 to accordingly increase the area of the buffer itself. This results in the increase in the area of the clock distribution circuit to give rise to the problem of accordingly increasing power consumption of the clock distribution circuit.

Another solution is the use of a clock distribution circuit disclosed in "P-boosted Source Followers: A Robust Energy-efficient Bus Driver Technique," 2001 Symposium on VLSI Circuits Digest of Technical Papers. However, this clock distribution circuit is constructed to involve the need for the addition of a new nMOS transistor to present a problem such that it is impossible to reduce the area of the clock distribution circuit. Further, a pMOS transistor in this clock distribution circuit also participates in the propagation of the rising edge of the clock signal.

The control AND gate 226 shown in FIGS. 7A and 7B has a drawback to be described below. When the control signal is HIGH and the rising edge of the clock signal is inputted to the control AND gate 226, the clock signal inputted to the NAND gate 240 at the first level makes a LOW-to-HIGH transition. The clock signal which is HIGH turns OFF the pMOS transistor 241 of the NAND gate 240 at the first level. The turning-OFF of the pMOS transistor 241 causes the nMOS transistors 243 and 244 to drive the inverter 245 at the second level. The buffer structure shown in FIG. 9 does not have the series-connected nMOS transistors 243 and 244. Thus, the control AND gate 226 cannot provide current characteristics and the like similar to those of the buffer shown in FIG. 9 in response to the rising edge of the clock signal.

The control OR gate 224 shown in FIGS. 8A and 8B has a drawback to be described below. When the control signal is LOW and the rising edge of the clock signal is inputted to the control OR gate 224, the clock signal inputted to the NOR gate 250 at the first level makes a LOW-to-HIGH transition. The clock signal which is HIGH turns OFF the pMOS transistor 252 of the NOR gate 250 at the first level. The turning-OFF of the pMOS transistor 252 causes the nMOS transistor 253 to drive the inverter 255 at the second level. Since the nMOS transistors 253 and 254 are connected in parallel and the nMOS transistor 254 is OFF, the control OR gate 224 becomes similar in construction to the buffer shown in FIG. 9. Thus, the control OR gate 224 can provide current characteristics and the like close to those of the buffer shown in FIG. 9 in response to the rising edge of the clock signal.

However, if the waveform of the input clock signal has a gentle slope, a short circuit current flows for a long time. Then, the influence of the pMOS transistors 251 and 252 becomes non-negligible, and the control OR gate 224 cannot provide the current characteristics and the like close to those of the buffer shown in FIG. 9 in response to the rising edge of the clock signal.

As described above, the clock distribution circuit which includes both the control AND gate 226 shown in FIGS. 7A and 7B and the control OR gate 224 shown in FIGS. 8A and 8B finds difficulties in adjusting the delay of the clock signal since the control AND gate 226 and the control OR gate 224 have different current characteristics and the like than those of the buffers. For this reason, the clock distribution circuit shown in FIG. 6 has clock signal skew higher than that of a clock distribution circuit comprised of only similar buffers.

SUMMARY OF THE INVENTION

It is an object of the present invention to provide a clock signal propagation gate capable of reducing clock signal skew, facilitating clock signal delay adjustment and controlling a clock signal, and a semiconductor integrated circuit including the clock signal propagation gate.

According to a first aspect of the present invention, a clock signal propagation gate includes an inverter, and a logic gate. The inverter includes: a first MOS transistor of a first conductivity type having a drain, a gate receiving a clock signal, and a source connected to a first potential point; and a second MOS transistor of a second conductivity type having a source connected to a second potential point, a drain connected to the drain of the first MOS transistor, and a gate connected to the gate of the first MOS transistor. The logic gate includes: a third MOS transistor of the second conductivity type having a gate connected directly to the drain of the first MOS transistor and to the drain of the second MOS transistor, a source connected to the second potential point, and a drain, the third MOS transistor having a current-driving capability greater than that of the first MOS transistor; a fourth MOS transistor of the first conductivity type having a gate, a drain connected to the drain of the third MOS transistor, and a source; a fifth MOS transistor of the first conductivity type having a drain connected to the source of the fourth MOS transistor, a source connected to the first potential point, and a gate; and a sixth MOS transistor of the second conductivity type having a drain connected to the drain of the third MOS transistor to serve as an output of the logic gate, a source connected to the second potential point, and a gate; The gate of one of the fourth and fifth MOS transistors is connected to the gate of the third MOS transistor. The gate of the other of the fourth and fifth MOS transistors is connected to the gate of the sixth MOS transistor. A transition of the clock signal from a first potential at the first potential point to a second potential at the second potential point propagates to the output of the logic gate when a logic corresponding to the second potential point is applied to the gate of the other of the fourth and fifth MOS transistors and to the gate of the sixth MOS transistor.

The clock signal propagation gate produces the effects of controlling the clock signal in a clock distribution circuit, providing current characteristics and the like close to those of a buffer, and reducing the influence of a short circuit current upon the slope of the waveform of the rising edge of the clock signal.

According to a second aspect of the present invention, a semiconductor integrated circuit includes a clock signal interconnect line, a buffer, at least one clock signal propagation gate, and a sequential circuit. The clock signal interconnect line propagates a rising edge of a clock signal. The buffer is on the clock signal interconnect line. The at least one clock signal propagation gate is the clock signal propagation gate as defined in the first aspect, and is on the clock signal interconnect line. The clock signal propagation gate propagates the clock signal when the first conductivity type is an n type, the second conductivity type is a p type, and a logic "high" is applied to the gates of the fourth and fifth MOS transistors. The sequential circuit is at an end point of the clock signal interconnect line. The sequential circuit is operated on the rising edge of the clock signal propagating through the clock signal interconnect line.

The semiconductor integrated circuit, which includes the clock signal propagation gate as defined in the first aspect, produces the effects of controlling the propagation of the rising edge of the clock signal in a clock distribution circuit, and providing clock signal skew as low as that of a clock distribution circuit comprised of only buffers.

According to a third aspect of the present invention, a semiconductor integrated circuit includes a clock signal interconnect line, a buffer, at least one clock signal propagation gate, and a sequential circuit. The clock signal interconnect line propagates a falling edge of a clock signal. The buffer is on the clock signal interconnect line. The at least one clock signal propagation gate is the clock signal propagation gate as defined in the first aspect, and is on the clock signal interconnect line. The clock signal. propagation gate propagates the clock signal when the first conductivity type is a p type, the second conductivity type is an n type, and a logic "low " is applied to the gates of the fourth and fifth MOS transistors. The sequential circuit is at an end point of the clock signal interconnect line. The sequential circuit is operated on the falling edge of the clock signal propagating through the clock signal interconnect line.

The semiconductor integrated circuit, which includes the clock signal propagation gate as defined in the first aspect, produces the effects of controlling the propagation of the falling edge of the clock signal in a clock distribution circuit, and providing clock signal skew as low as that of a clock distribution circuit comprised of only buffers.

These and other objects, features, aspects and advantages of the present invention will become more apparent from the following detailed description of the present invention when taken in conjunction with the accompanying drawings.

DESCRIPTION OF THE PREFERRED EMBODIMENTS

The present invention will now be described in detail with reference to the drawings illustrating preferred embodiments thereof.

<First Preferred Embodiment>

Figure 1A:
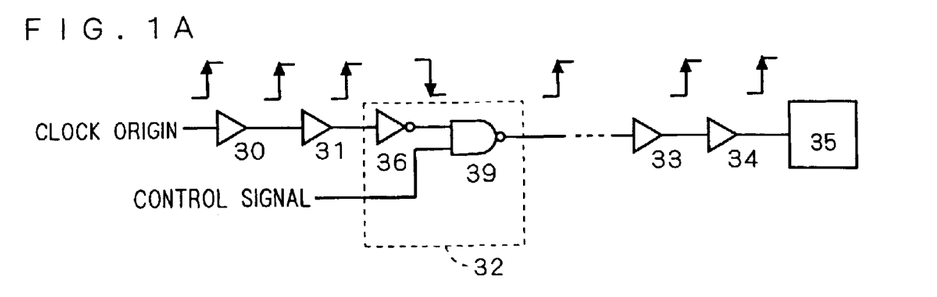
FIGS. 1A, 1B, 1C, 2A and 2B are partial circuit diagrams of a clock distribution circuit having a clock propagation control gate according to a first preferred embodiment of the present invention.
Figure 1B:
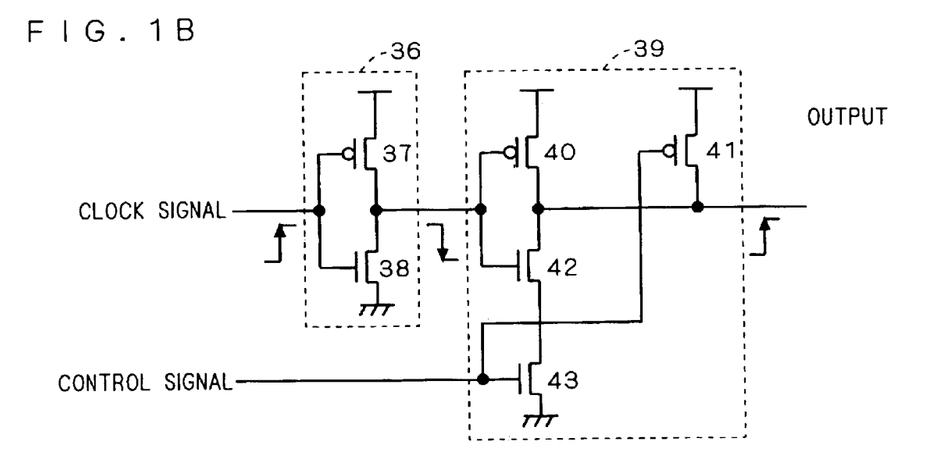
Figure 1C:
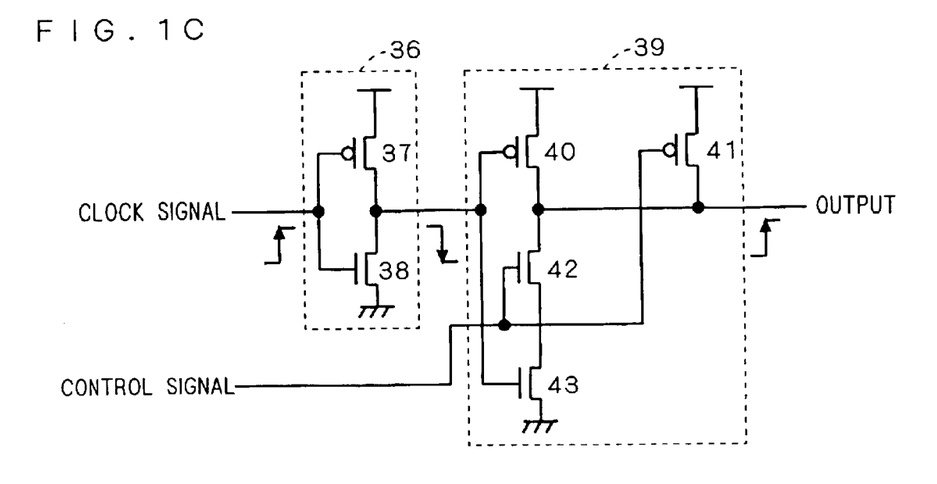

FIGS. 1A, 1B and 1C are partial circuit diagrams of a clock distribution circuit having a clock propagation control gate according to a first preferred embodiment of the present invention. FIG. 1A shows a single path from a clock origin of the clock distribution circuit to a sequential circuit 35 at an end point. First, a clock signal inputted at the clock origin propagates through buffers 30 and 31 to a clock propagation control gate 32. The two-level clock propagation control gate 32 includes an inverter 36 at the first level, and a NAND gate 39 at the second levels The clock signal passed through the clock propagation control gate 32 propagates through buffers 33 and 34 to reach the sequential circuit 35 at the end point. Although the sequential circuit 35 includes a plurality of flip-flops, the present invention may employ a sequential circuit including only a single flip-flop.

FIG. 1B is a circuit diagram of the clock propagation control gate 32. The inverter 36 at the first level includes a pMOS transistor 37 and an nMOS transistor 38. The gate of the pMOS transistor 37 and the gate of the nMOS transistor 38 are connected to each other to serve as the input of the inverter 36 for receiving the clock signal. The drain of the pMOS transistor 37 and the drain of the nMOS transistor 38 are connected to each other to serve as the output of the inverter 36.

The NAND gate 39 at the second level includes pMOS transistors 40, 41, and nMOS transistors 42, 43. The gate of the pMOS transistor 40 and the gate of the nMOS transistor 42 are connected to each other to serve as a first input of the NAND gate 39 which is directly connected to the output of the inverter 36. The drains of the pMOS transistors 40, 41 and the drain of the nMOS transistor 42 are connected together to serve as the output of the NAND gate 39. A control signal is applied to the gate terminals of the nMOS transistor 43 and the pMOS transistor 41. The source of the nMOS transistor 42 and the drain of the nMOS transistor 43 are connected to each other. The sources of the pMOS transistors 40 and 41 are connected to a potential the same as that to which the source of the pMOS transistor 37 of the inverter 36 is connected. The source of the nMOS transistor 43 and the source of the nMOS transistor 38 of the inverter 36 are grounded.

The clock propagation control gate 32 is designed so that at least the current-driving capability of the pMOS transistor 40 is greater than that of the nMOS transistor 38. Since the length of an interconnect line between the NAND gate 39 at the second level and a buffer having an input connected to the output of the NAND gate 39 is greater than the length of an interconnect line between the inverter 36 at the first level and the NAND gate 39 at the second level, it is necessary to increase the current-driving capability of the pMOS transistor 40 of the NAND gate 39 at the second level. Preferably, the current-driving capability of the pMOS transistor 40 is greater than that of the pMOS transistor 37, and the current-driving capability of the nMOS transistors 42 and 43 is greater than that of the nMOS transistor 38. The current-driving capability is adjustable, for example, by the transistor size (i.e. the ratio of gate width to gate length) of a MOS transistor. The sequential circuit 35 shown in FIG. 1A receives and holds data in synchronism with the rising edge of the clock signal applied thereto. The buffers 30, 31, 33 and 34 are similar in construction to the buffer shown in FIG. 9.

The operation of the clock propagation control gate 32 will be described. The control signal controls the propagation of the rising edge of the clock signal inputted to the clock propagation control gate 32. When the control signal is LOW, the output from the clock propagation control gate 32 remains HIGH independently of occurrence of the rising edge of the input clock signal. Thus, no rising edge of the clock signal propagates when the control signal is LOW.

On the other hand, when the control signal is HIGH, the input clock signal is inverted by the inverter 36, and is then inverted again by the NAND gate 39. Thus, the rising edge of the clock signal propagates when the control signal is HIGH.

The clock propagation control gate 32 constructed as described above can propagate the clock signal when the control signal is HIGH in a manner similar to the background art control AND gate 226 shown in FIGS. 7A and 7B. The pMOS transistor 37 of the inverter 36, the nMOS transistor 38 of the inverter 36 and the pMOS transistor 40 of the NAND gate 39 correspond to the pMOS transistor 261 of the first-level inverter 260 of the buffer shown in FIG. 9, the nMOS transistor 262 of the first-level inverter 260 and the pMOS transistor 264 of the second-level inverter 263, respectively. The gate width of the MOS transistors of the clock propagation control gate 32 is made approximately equal to the gate width of the corresponding MOS transistors of the buffer.

Since the falling edge of the output from the inverter 36 is thus propagated by the operation of the pMOS transistor 40 (whereas the pMOS transistor 41 is OFF), the clock propagation control gate 32 can provide the current characteristics and the like similar to those of the buffer shown in FIG. 9 in response to the rising edge of the clock signal to be propagated. The input timing of the control signal must be provided in consideration for the timing of the clock signal.

If the waveform of the input clock signal has a gentle slope, a short circuit current flows through a NOR gate and a NAND gate for a long time. In some cases, this, precludes the clock propagation control gate from providing the current characteristics and the like close to those of the buffer. However, the clock propagation control gate 32 shown in FIG. 1A includes the inverter at the first level. If the waveform of the rising edge of the clock signal inputted to the clock propagation control gate 32 has a gentle slope, the inverter 36 at the first level inverts the clock signal while shaping the waveform of the rising edge of the clock signal to apply the clock signal to the NAND gate 39 at the second level. Hence, the clock propagation control gate 32 can shorten the time for which the short circuit current flows through the NAND gate 39 even if the waveform of the input clock signal has a gentle slope. As a result, the influence of the short circuit current flowing through the NAND gate 39 at the second level is negligible, and the clock propagation control gate 32 can provide the current characteristics and the like close to those of the buffer shown in FIG. 9 in response to the rising edge of the clock signal.

Figure 2A:
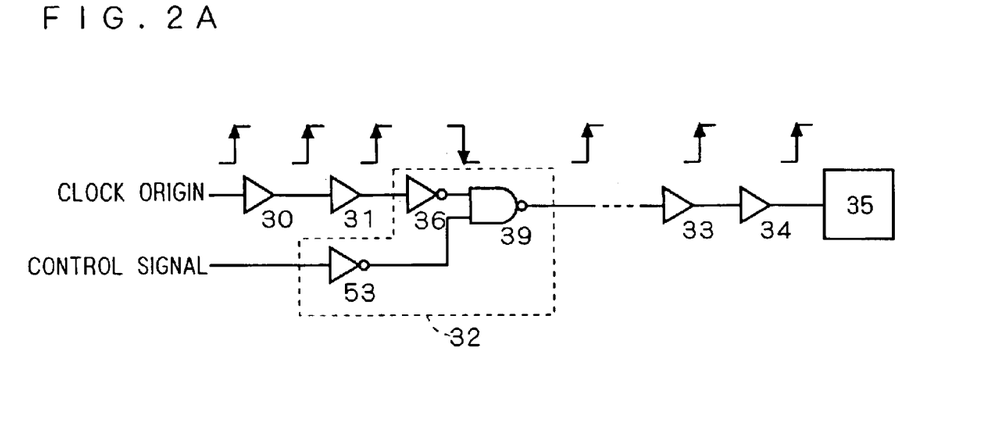
Figure 2B:
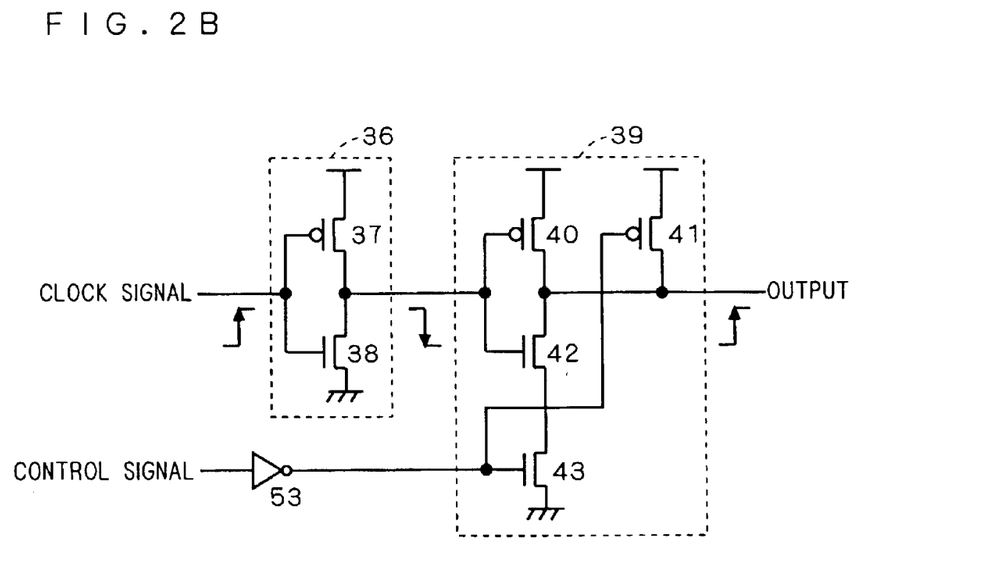

To construct the clock propagation control gate 32 so that the clock signal is stopped when the control signal is HIGH, a circuit configuration shown in FIGS. 2A and 2B may be used in place of the circuit configuration of FIGS. 1A and 1B. The clock propagation control gate 32 shown in FIG. 2A further includes an inverter 53 for inverting the logic of the control signal to apply its output to a second input of the NAND gate 39, that is, the gate of the nMOS transistor 43 and the gate of the pMOS transistor 47. The remaining structure of FIGS. 2A and 2B is identical with that of FIGS. 1A and 1B. When the control signal is HIGH, the output from the clock propagation control gate 32 is fixed at HIGH.

As discussed above, the clock propagation control gate shown in FIGS. 1A and 1B or FIGS. 2A and 2B has the current characteristics and the like similar to those of the buffers. Thus, the clock distribution circuit including both the clock propagation control gates shown in FIGS. 1A and 1B and FIGS. 2A and 2B can adjust the clock signal skew to a degree as low as that of a clock distribution circuit comprised of only buffers. The clock distribution circuit may include a plurality of clock propagation control gates.

The clock distribution circuit according to the first preferred embodiment as described above is adapted to propagate the rising edge of the clock signal inputted at the clock origin, and to include the sequential circuit operating on the rising edge of the clock signal. Alternatively, the clock distribution circuit may be adapted to propagate the rising edge of the clock signal inputted at the clock origin, to invert the rising edge of the clock signal to the falling edge of the clock signal before the clock signal is applied to the sequential circuit, and to include the sequential circuit operating on the falling edge of the clock signal.

FIG. 1C shows a modification of the clock propagation control gate 32 shown in FIG. 1B. The clock propagation control gate 32 of FIG. 1C is similar in construction to that of FIG. 1B except that the output from the inverter 36 is applied to the gate of the nMOS transistor 43 and that the control signal is applied to the gate of the nMOS transistor 42.

<Second Preferred Embodiment>

Figure 3A:
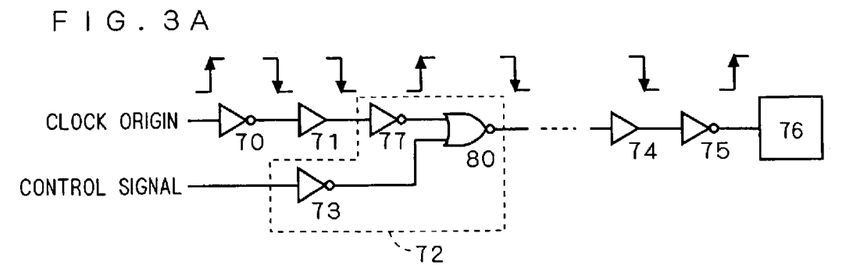
FIGS. 3A, 3B, 3C, 4A and 4B are partial circuit diagrams of a clock distribution circuit having a clock propagation control gate according to a second preferred embodiment of the present invention.
Figure 3B:
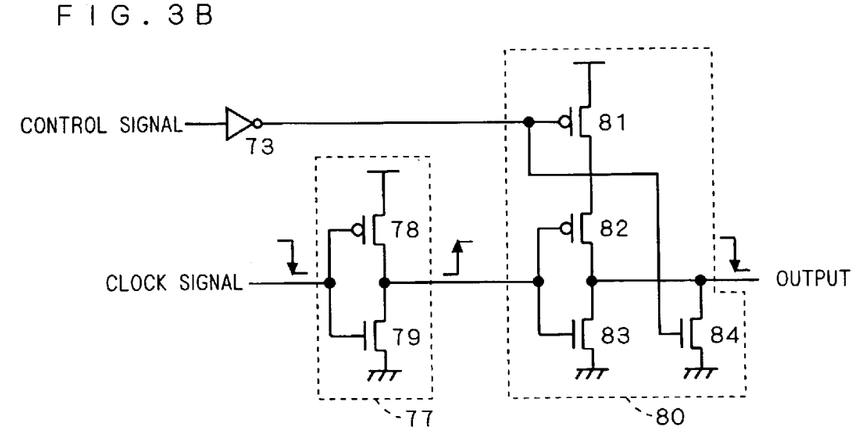
Figure 3C:
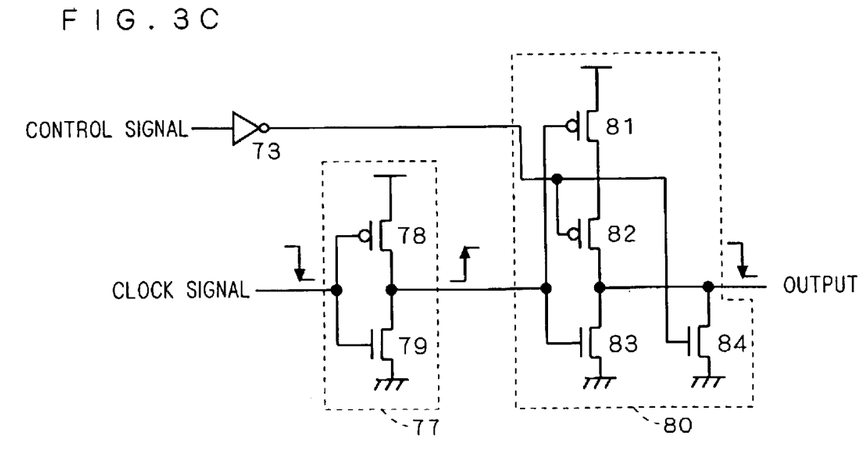

FIGS. 3A, 3B and 3C are partial circuit diagrams of a clock distribution circuit having a clock propagation control gate according to a second preferred embodiment of the present invention. FIG. 3A shows a single path from the clock origin of the clock distribution circuit to a sequential circuit 76 at an end point. First, a clock signal (rising edge) inputted at the clock origin is inverted by an inverter 70. The inverted clock signal (falling edge) propagates through a buffer 71 to a clock propagation control gate 72. The two-level clock propagation control gate 72 includes an inverter 77 at the first level, a NOR gate 80 at the second level, and an inverter 73 which receives a control signal. The inverted clock signal passed through the clock propagation control gate 72 propagates through a buffer 74 to an inverter 75. The inverter 75 inverts the propagated and inverted clock signal again back to the clock signal as inputted at the clock origin. This clock signal (rising edge) reaches the sequential circuit 76 at the end point. Although the sequential circuit 76 includes a plurality of flip-flops, the present invention may employ a sequential circuit including only a single flip-flop.

FIG. 3B is a circuit diagram of the clock propagation control gate 72. The inverter 77 at the first level includes a pMOS transistor 78 and an nMOS transistor 79. The gate of the pMOS transistor 78 and the gate of the nMOS transistor 79 are connected to each other to serve as the input of the inverter 77 for receiving the clock signal. The drain of the pMOS transistor 78 and the drain of the nMOS transistor 79 are connected to each other to serve as the output of the inverter 77.

The NOR gate 80 at the second level includes pMOS transistors 81, 82, and nMOS transistors 83, 84. The gate of the pMOS transistor 82 and the gate of the nMOS transistor 83 are connected to each other to serve as a first input of the NOR gate 80 which is directly connected to the output of the inverter 77. The drain of the pMOS transistor 82, and the drains of the nMOS transistors 83, 84 are connected together to serve as the output of the NOR gate 80. The control signal inverted by the inverter 73 is applied to the gate terminals of the pMOS transistor 81 and the nMOS transistor 84. The source of the pMOS transistor 82 and the drain of the pMOS transistor 81 are connected to each other. The source of the pMOS transistor 81 is connected to a potential the same as that to which the source of the pMOS transistor 78 of the inverter 77 is connected. The sources of the nMOS transistors 83, 84 and the source of the nMOS transistor 79 of the inverter 77 are grounded.

The clock propagation control gate 72 is designed so that at least the current-driving capability of the nMOS transistor 83 is greater than that of the pMOS transistor 78. Since the length of an interconnect line between the NOR gate 80 at the second level and a buffer having an input connected to the output of the NOR gate 80, is greater than the length of an interconnect line between the inverter 77 at the first level and the NOR gate 80 at the second level, it is necessary to increase the current-driving capability of the nMOS transistor 83 of the NOR gate 80 at the second level. Preferably, the current-driving capability of the pMOS transistors 81, 82 is greater than that of the pMOS transistor 78, and the current-driving capability of the nMOS transistor 83 is greater than that of the nMOS transistor 79. The sequential circuit 76 shown in FIG. 3A receives and holds data in synchronism with the rising edge of the clock signal applied thereto. The buffers 71 and 74 are similar in construction to the buffer shown in FIG. 9.

The operation of the clock propagation control gate 72 will be described. Although the propagation of the rising edge of the clock signal is important, the inverter 70 near the clock origin inverts the rising edge of the clock signal to the falling edge thereof in the second preferred embodiment. Thus, the falling edge of the clock signal is inputted to the clock propagation control gate 72. The control signal controls the propagation of the falling edge of the clock signal inputted to the clock propagation control gate 72.

When the control signal is LOW, the output from the clock propagation control gate 72 remains LOW independently of the occurrence of the falling edge of the input clock signal. Thus, no falling edge of the clock signal propagates when the control signal is LOW.

On the other hand, when the control signal is HIGH, the input clock signal is inverted by the inverter 77, and is then inverted again by the NOR gate 80. Thus, when the control signal is HIGH, a LOW is applied to the gate of the pMOS transistor 81 and the gate of the nMOS transistor 84, and the falling edge of the clock signal propagates.

The clock propagation control gate 72 constructed as described above can propagate the clock signal when the control signal is HIGH in a manner similar to the background art control AND gate 226 shown in FIGS. 7A and 7B. The pMOS transistor 78 of the inverter 77, the nMOS transistor 79 of the inverter 77 and the nMOS transistor 83 of the NOR gate 80 at the second level correspond to the pMOS transistor 261 of the first-level inverter 260 of the buffer shown in FIG. 9, the nMOS transistor 262 of the first-level inverter 260 and the nMOS transistor 265 of the second-level inverter 263, respectively. The gate width of the MOS transistors of the clock propagation control gate 72 is made approximately equal to the gate width of the corresponding MOS transistors of the buffer.

Since the falling edge of the output from the inverter 77 is thus propagated by the operation of the nMOS transistor 83 (whereas the nMOS transistor 84 is OFF), the clock propagation control gate 72 can provide the current characteristics and the like similar to those of the buffer shown in FIG. 9 in response to the falling edge of the clock signal to be propagated. The input timing of the control signal must be provided in consideration for the timing of the clock signal.

If the waveform of the input clock signal has a gentle slope, a short circuit current flows through a NOR gate and a NAND gate for a long time. In some cases, this precludes the clock propagation control gate from providing the current characteristics and the like close to those of the buffer. However, the clock propagation control gate 72 shown in FIG. 3A includes the inverter at the first level, and the NOR gate at the second level. If the waveform of the falling edge of the clock signal inputted to the clock propagation control gate 72 has a gentle slope, the inverter 77 at the first level inverts the clock signal while shaping the waveform of the falling edge of the clock signal to apply the clock signal to the NOR gate 80 at the second level. Hence, the clock propagation control gate 72 can shorten the time for which the short circuit current flows through the NOR gate 80 even if the waveform of the input clock signal has a gentle slope. As a result, the influence of the short circuit current flowing through the NOR gate 80 at the second level is negligible, and the clock propagation control gate 72 can provide the current characteristics and the like similar to those of the buffer shown in FIG. 9 in response to the falling edge of the clock signal.

Figure 4A:
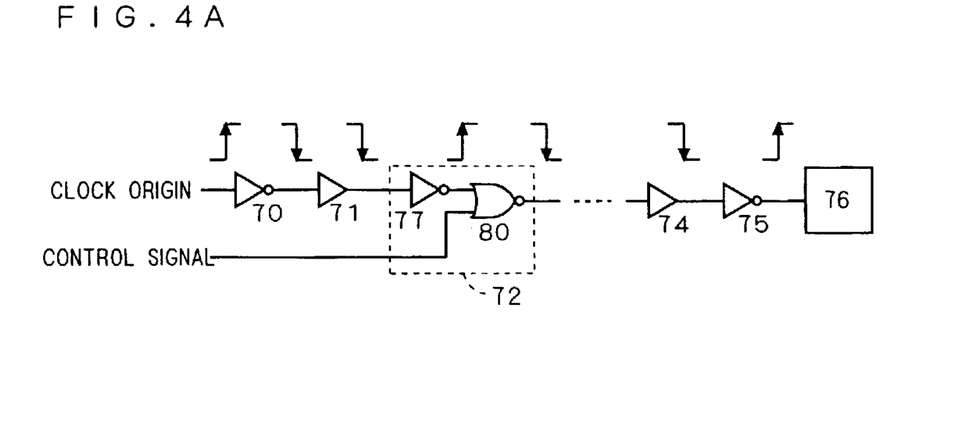
Figure 4B:
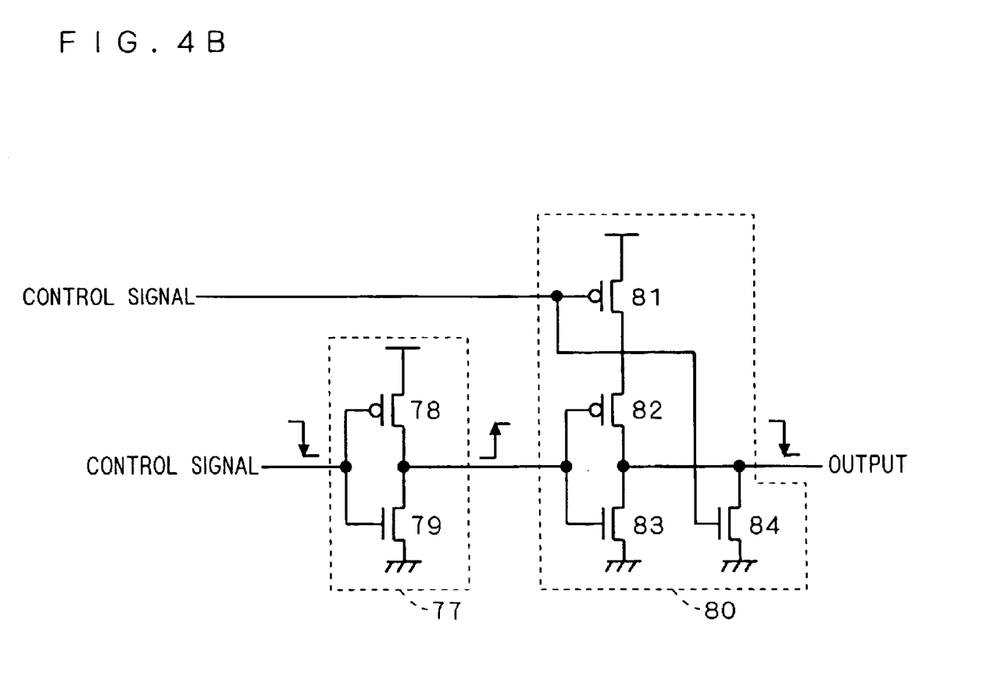

To construct the clock propagation control gate 72 so that the clock signal is stopped when the control signal is HIGH, a circuit configuration shown in FIGS. 4A and 4B may be used in place of the circuit configuration of FIGS. 3A and 3B. In the clock propagation control gate 72 shown in FIG. 4A, the control signal is applied directly to a second input of the NOR gate 80, that is, the gate of the pMOS transistor 81 and the gate of the nMOS transistor 84. The remaining structure of FIGS. 4A and 4B is identical with that of FIGS. 3A and 3B. When the control signal is HIGH, the output from the clock propagation control gate 72 is fixed at LOW.

As discussed above, the clock propagation control gate shown in FIGS. 3A and 3B or FIGS. 4A and 4B has the current characteristics and the like similar to those of the buffers. Thus, the clock distribution circuit including both the clock propagation control gates shown in FIGS. 3A and 3B and FIGS. 4A and 4B provides the clock signal skew as low as that of a clock distribution circuit comprised of only buffers, and can make an adjustment to reduce the skew, as in the first preferred embodiment. The clock distribution circuit may include a plurality of clock propagation control gates.

Further, according to the second preferred embodiment, the clock signal is inverted by the inverter (corresponding to the inverter 70) just following the clock origin, and the inverted clock signal is propagated in the clock distribution circuit and is inverted again by the inverter (corresponding to the inverter 75) just prior to the end point. Thus, during the propagation of the clock signal through the buffers in the clock distribution circuit, the pMOS transistor of the second-level inverter of a buffer having a low driving capability is not used, but the nMOS transistor of the second-level inverter of a buffer having a high driving capability is used. Therefore, the second preferred embodiment suppresses the increase in the propagation delay of the clock signal after the clock signal passes through the buffers, to facilitate the delay adjustment of the clock signal.

Additionally, the gate width of the pMOS transistor of the second-level inverter of the buffer need not particularly be increased in the second preferred embodiment. This eliminates the need to increase the area of the clock distribution circuit to accordingly prevent the increase in power consumption of the clock distribution circuit. Therefore, the second preferred embodiment provides the clock distribution circuit capable of controlling the clock signal, reducing the clock signal skew and the area occupied by the circuit, facilitating the delay adjustment of the clock signal, and achieving low power consumption.

The clock distribution circuit according to the second preferred embodiment as described above is adapted to cause the inverter (corresponding to the inverter 70) to invert the rising edge of the clock signal inputted at the clock origin, to propagate the falling edge of the clock signal, to cause the inverter (corresponding to the inverter 75) to invert the falling edge of the clock signal to the rising edge of the clock signal again just prior to the sequential circuit, and to include the sequential circuit operating on the rising edge of the clock signal. Alternatively, the present invention may provide a clock distribution circuit adapted such that the falling edge of the clock signal inputted at the clock origin is propagated and the sequential circuit operates on the falling edge of the clock signal or such that the inverter (corresponding to the inverter 75) of the second preferred embodiment just prior to the sequential circuit is removed and the sequential circuit operates on the rising edge of the clock signal.

FIG. 3C shows a modification of the clock propagation control gate 72 shown in FIG. 3B. The clock propagation control gate 72 of FIG. 3C is similar in construction to that of FIG. 3B except that the output from the inverter 77 is applied to the gate of the pMOS transistor 81 and that the control signal is applied to the gate of the pMOS transistor 82.

While the invention has been described in detail, the foregoing description is in all aspects illustrative and not restrictive. It is understood that numerous other modifications and variations can be devised without departing from the scope of the invention.

What is claimed is:

1. A clock signal propagation gate comprising:
   (a) an inverter including
      a first MOS transistor of a first conductivity type having a drain, a gate receiving a clock signal, and a source connected to a first potential point, and
      a second MOS transistor of a second conductivity type having a source connected to a second potential point, a drain connected to said drain of said first MOS transistor, and a gate connected to said gate of said first MOS transistor; and
   (b) a logic gate including
      a third MOS transistor of said second conductivity type having a gate connected directly to said drain of said first MOS transistor and to said drain of said second MOS transistor, a source connected to said second potential point, and a drain, said third MOS transistor having a current-driving capability greater than that of said first MOS transistor,
      a fourth MOS transistor of said first conductivity type having a gate, a drain connected to said drain of said third MOS transistor, and a source,
      a fifth MOS transistor of said first conductivity type having a drain connected to said source of said fourth MOS transistor, a source connected to said first potential point, and a gate, and
      a sixth MOS transistor of said second conductivity type having a drain connected to said drain of said third MOS transistor to serve as an output of said logic gate, a source connected to said second potential point, and a gate,
   said gate of one of said fourth and fifth MOS transistors being connected to said gate of said third MOS transistor, said gate of the other of said fourth and fifth MOS transistors being connected to said gate of said sixth MOS transistor,
   wherein a transition of said clock signal from a first potential at said first potential point to a second potential at said second potential point propagates to said output of said logic gate when a logic corresponding to said second potential point is applied to said gate of the other of said fourth and fifth MOS transistors and to said gate of said sixth MOS transistor.

2. A semiconductor integrated circuit comprising:
   a clock signal interconnect line for propagating a rising edge of a clock signal;
   a buffer on said clock signal interconnect line;
   at least one clock signal propagation gate on said clock signal interconnect line, said at least one clock signal propagation gate including
      (a) an inverter including
         a first MOS transistor of a first conductivity type having a drain, a gate receiving the clock signal, and a source connected to a first potential point, and
         a second MOS transistor of a second conductivity type having a source connected to a second potential point, a drain connected to said drain of said first MOS transistor, and a gate connected to said gate of said first MOS transistor, and
      (b) a logic gate including
         a third MOS transistor of said second conductivity type having a gate connected directly to said drain of said first MOS transistor and to said drain of said second MOS transistor, a source connected to said second potential point, and a drain, said third MOS transistor having a current-driving capability greater than that of said first MOS transistor,
         a fourth MOS transistor of said first conductivity type having a gate, a drain connected to said drain of said third MOS transistor, and a source,
         a fifth MOS transistor of said first conductivity type having a drain connected to said source of said fourth MOS transistor, a source connected to said first potential point, and a gate, and
         a sixth MOS transistor of said second conductivity type having a drain connected to said drain of said third MOS transistor to serve as an output of said logic gate, a source connected to said second potential point, and a gate,
      said gate of one of said fourth and fifth MOS transistors being connected to said gate of said third MOS transistor, said gate of the other of said fourth and fifth MOS transistors being connected to said gate of said sixth MOS transistor,
      wherein a transition of said clock signal from a first potential at said first potential point to a second potential at said second potential point propagates to said output of said logic gate when a logic corresponding to said second potential point is applied to said gate of the other of said fourth and fifth MOS transistors and to said gate of said sixth MOS transistor, and
      wherein said at least one clock signal propagation gate propagates said clock signal when said first conductivity type is an n type, said second conductivity type is a p type, and a logic "high" is applied to the gates of said fourth and fifth MOS transistors; and
   a sequential circuit at an end point of said clock signal interconnect line, said sequential circuit being operated on said rising edge of said clock signal propagating through said clock signal interconnect line.

3. A semiconductor integrated circuit comprising:
   a clock signal interconnect line for propagating a falling edge of a clock signal;

a buffer on said clock signal interconnect line;
at least one clock signal propagation gate on said clock signal interconnect line, said at least one clock signal propagation gate including
  (a) an inverter including
    a first MOS transistor of a first conductivity type having a drain, a gate receiving the clock signal, and a source connected to a first potential point, and
    a second MOS transistor of a second conductivity type having a source connected to a second potential point, a drain connected to said drain of said first MOS transistor, and a gate connected to said gate of said first MOS transistor, and
  (b) a logic gate including
    a third MOS transistor of said second conductivity type having a gate connected directly to said drain of said first MOS transistor and to said drain of said second MOS transistor, a source connected to said second potential point, and a drain, said third MOS transistor having a current-driving capability greater than that of said first MOS transistor,
    a fourth MOS transistor of said first conductivity type having a gate, a drain connected to said drain of said third MOS transistor, and a source,
    a fifth MOS transistor of said first conductivity type having a drain connected to said source of said fourth MOS transistor, a source connected to said first potential point, and a gate, and
    a sixth MOS transistor of said second conductivity type having a drain connected to said drain of said third MOS transistor to serve as an output of said logic gate, a source connected to said second potential point, and a gate,
    said gate of one of said fourth and fifth MOS transistors being connected to said gate of said third MOS transistor, said gate of the other of said fourth and fifth MOS transistors being connected to said gate of said sixth MOS transistor,
    wherein a transition of said clock signal from a first potential at said first potential point to a second potential at said second potential point propagates to said output of said logic gate when a logic corresponding to said second potential point is applied to said gate of the other of said fourth and fifth MOS transistors and to said gate of said sixth MOS transistor, and
    wherein said at least one clock signal propagation gate propagates said clock signal when said first conductivity type is a p type, said second conductivity type is an n type, and a logic "low " is applied to the gates of said fourth and fifth MOS transistors; and
  a sequential circuit at an end point of said clock signal:interconnect line, said sequential circuit being operated on said falling edge of said clock signal propagating through said clock signal interconnect line.

4. The semiconductor integrated circuit according to claim 2, further comprising:
  a second inverter just following a starting point of said clock signal interconnect line; and
  a third inverter just prior to said end point of said clock signal interconnect line.

5. The semiconductor integrated circuit according to claim 3, further comprising:
  a second inverter just following a starting point of said clock signal interconnect line; and
  a third inverter just prior to said end point of said clock signal interconnect line.

* * * * *